United States Patent [19]

Kaplan

[11] 4,188,593
[45] Feb. 12, 1980

[54] RC OSCILLATOR

[75] Inventor: Leonard A. Kaplan, Fords, N.J.

[73] Assignee: RCA Corporation, New York, N.Y.

[21] Appl. No.: 941,140

[22] Filed: Sep. 11, 1978

[51] Int. Cl.² ............................................. H03B 5/26
[52] U.S. Cl. ................................ 331/108 D; 331/110; 331/140; 331/141
[58] Field of Search ................... 331/108 D, 110, 138, 331/140, 141, 142

[56] References Cited

U.S. PATENT DOCUMENTS

| | | | |
|---|---|---|---|
| 3,114,117 | 12/1963 | Anderson | 331/141 |
| 3,739,300 | 6/1973 | Tyre | 331/141 |

*Primary Examiner*—Siegfried H. Grimm
*Attorney, Agent, or Firm*—Paul J. Rasmussen; Allen LeRoy Limberg; Allan J. Jacobson

[57] ABSTRACT

An RC oscillator comprising an amplifier with a first RC voltage divider coupling its output circuit to its non-inverting input circuit and a second RC voltage divider coupling its non-inverting input circuit to its inverting input circuit. The first RC voltage divider comprises a series RC network in its series arm and parallel RC network in its shunt leg. The second RC voltage divider has a capacitor in its series arm and a resistor in its shunt leg.

9 Claims, 3 Drawing Figures

RC OSCILLATOR

The present invention relates to RC oscillators.

Improvement over the standard Wien bridge oscillator was sought by the present inventor using three RC networks. It was desired to find an oscillator configuration that could be adjusted using a standard three-gang tuning capacitor that tunes over a 10:1 capacitance range to obtain a 10:1 frequency range of adjustment without need for band switching. Such ganged capacitors have a common connection between them, which must be accommodated by an oscillator configuration using them.

Standard three-section ganged tuning capacitors come in two varieties: those that have equal capacitance in all three sections (so-called TRF capacitors) and those that have capacitances in ratios to facilitate superhetrodyne radio receiver design. While the type of oscillator to be described could be built with the latter type of ganged tuning capacitors, or with especial ganged tuning capacitors, design is most straightforward with a tuning capacitor having equal capacitances in all three sections.

Figure 1:
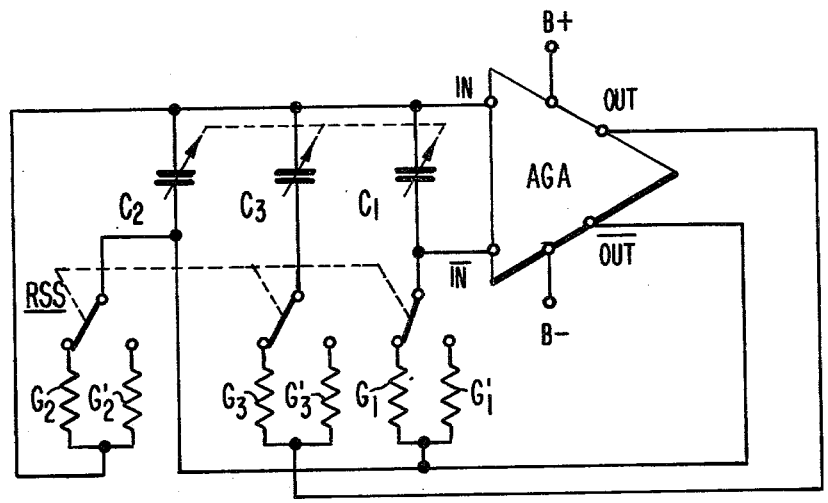
FIG. 1 is a schematic diagram of the basic oscillator configuration embodying the present invention.

In FIG. 1, the adjustable-gain amplifier AGA has first and second input terminals IN and $\overline{\text{IN}}$, respectively, and first and second output terminals OUT and $\overline{\text{OUT}}$, respectively. Amplifier AGA accepts differential signals between IN and $\overline{\text{IN}}$ and exhibits very high internal input impedance between these terminals as compared to the reactance of C1 at the frequency of oscillation. Amplifier AGA responds to potential variation appearing between $\overline{\text{IN}}$ and IN with potential variation between $\overline{\text{OUT}}$ and OUT that is of similar sense and A times as large in amplitude. The RC network comprising resistors with conductances $G_1$, $G_2$ and $G_3$ and capacitors with capacitances $C_1$, $C_2$ and $C_3$ is connected to amplifier AGA to complete a regenerative feedback loop that will provide $\pi$ radians phase-shift at a particular frequency, giving rise to a tendency towards oscillation at that frequency. The gain A of the amplifier AGA is adjusted, by methods similar to those employed in Wien bridge oscillators, to just sufficient value to sustain oscillations.

It is usually most convenient to use a three-gang tuning capacitor to provide $C_1$, $C_2$ and $C_3$, the tuning capacitor providing for continuous tuning over about a decade or so of frequency variation. Where more than one decade of tuning range is desired, a range selector switch RSS as shown may be used to alternatively select resistors with conductances $G_1'$, $G_2'$, $G_3'$ which are proportional to $G_1$, $G_2$ and $G_3$, respectively, by a suitable range factor—E.G., 1/10 or 10.

Figure 2:
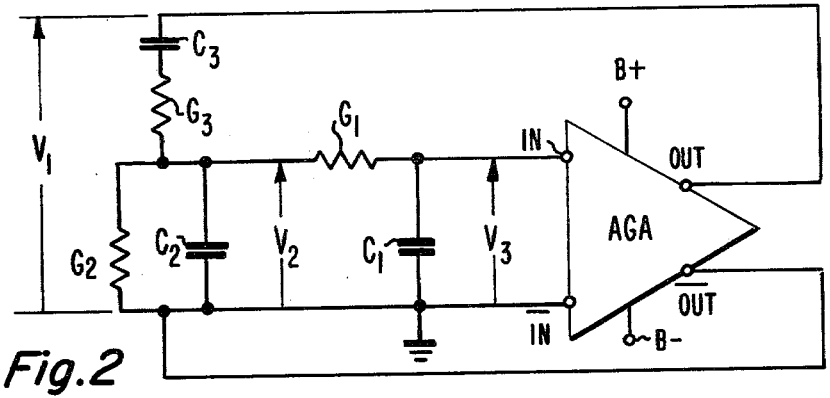
FIG. 2 is a re-arrangement of the basic oscillator configuration that simplifies analysis of oscillator operation.

The basic oscillator configuration can be arranged as shown in FIG. 2 to facilitate analysis. Oscillations will sustain themselves for the frequency at which the RC network exhibits a transfer function $V_3/V_1$ equal to $1/A$, where A is the voltage gain of amplifier AGA.

The RC network may be viewed as a two-stage potential divider. Generally speaking, a potential divider in which the input voltage $V_{IN}$ is applied across the series connection of first and second elements having admittances $Y_1$ and $Y_2$, respectively, and the output voltage $V_{OUT}$ is taken across the second element behaves in accordance with the following equation.

$$(V_{OUT}/V_{IN}) = Y_1/(Y_1 + Y_2) \quad (1)$$

Applying this teaching to the circuit of FIG. 2, equations 2 and 3 may then be written in accordance with equation 1, s being the complex frequency in radians.

$$(V_2/V_1) = [sC_3G_3/(G_3 + sC_3)]/ \quad (2)$$
$$\{[sC_3G_3/(G_3 + sC_3)] + (G_2 + sC_2) + [sC_1G_1/(G_1 + sC_1)]\}$$

$$(V_3/V_2) = G_1/(G_1 + sC_1) \quad (3)$$

Equations 2 and 3 can be cross-solved against $V_2$ to obtain equation 4.

$$(V_3/V_1) = sC_3G_1G_3/\{G_1G_2G_3 + \quad (4)$$
$$s^2(C_1C_2G_3 + C_2C_3G_1 + C_1C_3G_1 + C_1C_3G_2 + C_1C_3G_3) +$$
$$s[(C_1G_2G_3 + C_2G_1G_3 + C_2G_2G_3 + C_3G_1G_2) + s^2C_1C_2C_3]\}$$

In order that $(V_3/V_1) = -A$, the real part of the denominator of the fraction in the right hand side of equation 4 must be zero-valued. This condition defines equation 5, following, wherein the real term, $\sigma$, in the complex frequency $s = \sigma + j\omega$ is dropped, leaving only its imaginary component $j\omega$.

$$G_1G_2G_3 = \omega^2(C_1C_2G_3 + C_2C_3G_1 + C_1C_3G_1 \quad (5)$$
$$+ C_1C_3G_2 + C_1C_3G_3)$$

Then for $(V_3/V_1)$ to equal $1/(-A)$, equation 6 must obtain, wherein the real term $\sigma$ in the complex frequency s is dropped.

$$C_1G_2G_3 + C_1G_1G_3 + C_2G_1G_3 + C_3G_1G_2 + C_3G_1G_3 \quad (6)$$
$$- AC_3G_1G_3 = \omega^2C_1C_2C_3$$

Equations 5 and 6 permit a number of degrees of design freedom.

Returning to the basic oscillator configuration of FIG. 1, it is desirable in a tuned oscillator to use a three-gang variable capacitor wherein each of the variable capacitors has the same capacitance as the others with which it is ganged. Equations 5 and 6 then reduce to equations 7 and 8, following.

$$G_1G_2G_3 = (\omega C)^2(2G_1 + G_2 + 2G_3) \quad (7)$$

$$G_1G_2 + G_2G_3 + (3 - A)G_1G_3 = (\omega C)^2 \quad (8)$$

For chosen values of A and $\omega$, setting any two of the terms C, $G_1$, $G_2$ and $G_3$ to values of choice allows the others to be determined from equations 7 and 8.

Cross-solution of equations 7 and 8 to eliminate the term $(\omega C)^2$ results in equation 9, following, which indicates that the gain A required of the amplifier to sustain constant-amplitude oscillations depends only on $G_1$, $G_2$ and $G_3$ at any frequency and ganged-capacitance setting.

$$A = 3 + (G_2/G_3) + (G_2/G_1) - G_2/(2G_1 + G_2 + 2G_3) \quad (9)$$

This makes it clear that the substitution of resistors with conductances $G_1'$, $G_2'$ and $G_3'$ instead of those with conductances $G_1$, $G_2$ and $G_3$ to change frequency range will not cause change in the amplitude at which oscillations are maintained as long as $G_1: G_2: G_3 :: G_1': G_2': G_3'$.

Now, in changing from one range to another using a range selector switch RSS, some error in maintaining these proportions is to be expected. This will cause change in the amplitude of the oscillator from one range to another, so it is desirable to know that the fractional change in oscillator amplitude with fractional departure of resistive elements from nominal value is not great. It can be shown, for example, that in a Wien bridge a fractional departure of one of its resistive elements from nominal value will cause a fractional change one-third as large in the amplifier gain required to maintain stable oscillations.

As a first step in analyzing this sensitivity of amplifier gain to departure of resistive elements from nominal value, equation 10 is derived by replacing $G_1$ with $1/R_1$, $G_2$ with $1/R_2$, and $G_3$ with $1/R_3$, and thereafter rearranging terms.

$$A = 3 + (R_1/R_2) + (R_3/R_2) - R_1R_3/(2R_1R_2 + 2R_2R_3 + R_1R_3) \quad (10)$$

The voltage gain A required of amplifier AGA is then partially differentiated in turn for $R_1$, $R_2$ and $R_3$ to determine the sensitivities of A to variations in these resistances, as expressed in equations 11, 12 and 13, respectively.

$$(\delta A/\delta R_1) = \quad (11)$$
$$(1/R_2) - [2R_2R_3^2/(2R_1R_2 + 2R_2R_3 + R_1R_3)^2]$$

$$(\delta A/\delta R_2) = - [(R_1 + R_3)/R_2^2] + [2R_1R_3(R_1 + R_3) \quad (12)$$
$$/(2R_1R_2 + 2R_2R_3 + R_1R_3)^2]$$

$$(\delta A/\delta R_3) = \quad (13)$$
$$(1/R_2) - 2R_1^2R_2/(2R_1R_2 + 2R_2R_3 + R_1R_3)^2]$$

Equations 11, 12 and 13 may be rewritten as equations 14, 15 and 16 to make the effect of resistor change upon gain change more evident.

$$(\delta A/A) = (R_1/A) \{(1/R_2) - [2R_2R_3^2/(2R_1R_2 + 2R_2R_3 \quad (14)$$
$$+ R_1R_3)^2\} (\delta R_1/R_1)$$

$$(\delta A/A) = \quad (15)$$
$$(R_2/A) \{-[(R_1 + R_3)/R_2^2] + [2R_1R_3(R_1 + R_3)$$
$$/(2R_1R_2 + 2R_2R_3 + R_1R_3)^2]\} (\delta R_2/R_2)$$

$$(\delta A/A) = \quad (16)$$
$$(R_3/A \{(1/R_2) - 2R_1^2R_2/(2R_1R_2 + 2R_2R_3 + R_1R_3)^2]\}$$
$$(\delta R_3/R_3)$$

Surprisingly, the total $(\delta A/A)$ required to compensate against fractional variations of the resistors $R_1$, $R_2$ and $R_3$ sums to zero, supposing the three resistors to have exhibited similar fractional variations—owing, for example, to temperature variations. This is true no matter how the resistors $R_1$, $R_2$ and $R_3$ are chosen. This contrasts with the Wien bridge where the resistive elements must have equal values of resistance for no $\delta A/A$ to be required for compensating against their equal fractional variations.

However, supposing the fractional variations $\delta R_1/R_1$, $\delta R_2/R_2$ and $\delta R_3/R_3$ not to be exactly alike, one may attempt to choose values of $R_1$, $R_2$ and $R_3$ which minimize the $\delta A/A$ fractional variations required to compensate for them. Interestingly, by making $R_1$ and $R_3$ each have the value $R_x$— i.e., by making $G_1 = G_3 = 1/R_x$— the same relationships between $R_2$ and $R_x$ minimize the $\delta A/A$ terms in all of the equations 14, 15 and 16. Simplifying equations 14 and 15 to reflect $R_1 = R_3 = R_x$ one obtains in each instance the simpler equation 17.

$$(\delta A/A) = \quad (17)$$
$$(R_x/A) \{(1/R_2) - [2R_2(4R_2 + R_x)^2]\} (\delta R_x/R_x)$$

Simplifying equation 15 to reflect $R_1 = R_3 = R_x$ one obtains equation 18.

$$(\delta A/A) = \quad (18)$$
$$(R_2/A) \{-[2R_x/R_2^2] + 4R_x/(4R_2 + R_x^2]\}$$
$$(\delta R_2/R_2)$$

One may generalize equations 17 and 18 as equation 19, where K is a constant equal to 1 in equation 17 and to $(-2)$ in equation 18.

$$(\delta A/A) = \quad (19)$$
$$(K/A) \{(R_x/R_2) - [2R_2R_x/(4R_2 + R_x)^2]\} (\delta R/R)$$

The term A is given by equation 20 when $R_1 = R_3 = R_x$.

$$A = 3 + (2R_x/R_2) - [R_x/(4R_2 + R_x)] \quad (20)$$

Substituting equation 20 into equation 19 one obtains equation 21.

$$\delta A/A = K \{(R_x/R_2) - [2R_2R_x/(4R_2 + R_x)^2]\} (\delta R/R)/ \quad (21)$$
$$\{3 + 2(R_x/R_2) - [R_x/(4R_2 + R_x)]\}$$

The following table shows values of $\delta A/A$ divided by $\delta R/R$ for various values of K and $R_x/R_2$.

| $R_x/R_2$ | $\delta A/A \div \delta R/R$ for $K = 1$ | $\delta A/A \div \delta R/R$ for $K = 2$ |
| --- | --- | --- |
| 0.100 | 0.028 | 0.056 |
| 0.133 | 0.036 | 0.072 |
| 0.178 | 0.048 | 0.096 |
| 0.237 | 0.062 | 0.124 |
| 0.316 | 0.079 | 0.158 |
| 0.422 | 0.101 | 0.202 |
| 0.562 | 0.127 | 0.254 |
| 0.75 | 0.157 | 0.314 |
| 1.00 | 0.192 | 0.383 |
| 1.334 | 0.229 | 0.458 |
| 1.778 | 0.268 | 0.536 |

-continued

| $R_x/R_2$ | $\delta A/A \div \delta R/R$ for $K = 1$ | $\delta A/A \div \delta R/R$ for $K = 2$ |
|---|---|---|
| 2.371 | 0.306 | 0.612 |
| 3.162 | 0.342 | 0.684 |

Note for values of $R_x/R_2$ ranging upwards to about 0.75, less change $\delta A$ in the gain A of amplifier AGA is required to compensate for $\delta R/R$ in the oscillator of FIG. 1 than in the Wien bridge oscillator.

Figure 3:
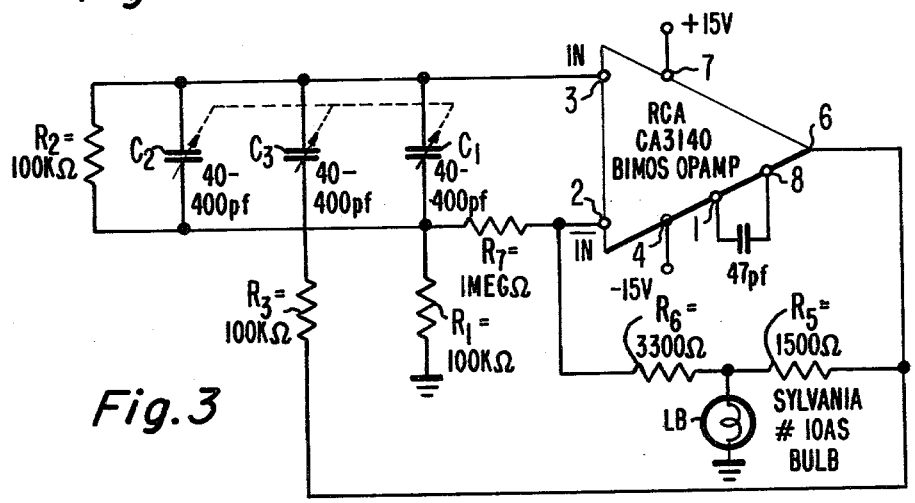
FIG. 3 is a schematic diagram of an oscillator configuration embodying the present invention illustrating how one may gain-control the amplifier portion of the oscillator.

FIG. 3 shows an oscillator constructed for a frequency range spanning 3.4 to 41.3 kilohertz. It provides a 7.0±0.05 volt output voltage. The adjustable-gain amplifier is a CA 3140 operational amplifier manufactured by RCA Corporation. Its pins 7 and 4 connect to positive and negative operating supplies, respectively. A supplemental roll-off capacitor (47 pf) connects its pins 1 and 8. This operational amplifier is a BIMOS type utilizing both metal-oxide-semiconductor (MOS) field effect transistors and bipolar transistors. MOS field effect transistors in long-tailed pair configuration are used in its input stage, their gates being connected to inverting and non-inverting input signal pins 2 and 3 to offer very high input impedance.

The closed-loop voltage gain of the CA 3140 is determined by a non-linear degenerative feedback connection from its output signal pin 6 to its input signal pin 2. This feedback connection includes a resistive potential divider, which comprises the series connection of linear resistive element $R_5$ and light bulb LB, and a linear resistive element $R_6$ which is used to apply the divided output signal potential appearing across light bulb LB to the inverting input signal pin 2 of the CA 3140. Resistive element $R_7$ has high resistance for buffering the potential appearing across $C_1$ from the relatively low resistance offered by the feedback connection including $R_5$, LB and $R_6$; and $R_6$ is chosen to have high enough resistance that the attenuation provided by potential division between $R_7$ and the feedback connection is not so large but what the CA 3140 can provide sufficient voltage gain to build up and maintain oscillations of desired amplitude in the regenerative feedback loop.

When the output signal potential at pin 6 of the CA 3140 is relatively small, the current flowing through the series connection of $R_5$ and LB is relatively small, so light bulb LB tends to exhibit its relatively low cold resistance, tending to decrease degenerative feedback. This allows oscillations to build up amplitude in the regenerative feedback connection. As the output signal potential at pin 6 grows, more current flows through $R_5$ to the light bulb LB, tending to cause LB to exhibit its relatively high hot resistance, increasing the effect of the degenerative feedback to curtail further growth in the amplitude of oscillations.

One skilled in the art will be enabled by the foregoing disclosure to generate other embodiments of the present invention, and the following claims should be liberally construed to include such variations within their provisions, examples of which variations follow. The resistances $R_1$, $R_2$, $R_3$ and capacitances $C_1$, $C_2$, $C_3$ may all be fixed for single-frequency operation. Fixed capacitances $C_1$, $C_2$ and $C_3$ may be used together with ganged continuously variable resistances $R_1$, $R_2$ and $R_3$ in an oscillator embodying the present invention. The capacitors $C_1$, $C_2$ and $C_3$ may be electrically tuned varicaps; or the resistances $R_1$, $R_2$ and $R_3$ may be electrically controlled resistances as provided, for example, by the channels of field effect transistors.

What I claim is:

1. An RC oscillator comprising:
   an amplifier having a high-impedance input circuit between first and second terminals and having an output circuit, and exhibiting a voltage gain of A between its input and output circuits;
   a first resistor with a conductance $G_1$ and a first capacitor with a capacitance $C_1$ connected in a first series combination;
   a secnd resistor with a conductance $G_2$ and a second capacitor with a capacitance $C_2$ parallelly connected with each other and said first series combination in a first parallel combination;
   a third resistor with a conductance $G_3$ and a third capacitor with a capacitance $C_3$ serially connected with each other and said first parallel combination in a second series combination;
   means for applying potential appearing across the output circuit of said amplifier across said second series combination; and
   means for applying the potential appearing across said first capacitor to the input circuit of said amplifier to complete a regenerative loop for oscillating at a frequency of $\omega$ radians per second.

2. An RC oscillator as set forth in claim 1 wherein $C_1$, $C_2$, $C_3$, $G_1$, $G_2$ and $G_3$ have values that satisfy the following two equations:

$$G_1 G_2 G_3 = \omega^2(C_1 C_2 G_3 + C_2 C_3 G_1 + \quad \text{(a)}$$
$$C_1 C_3 G_1 + C_1 C_3 G_2 + C_1 C_3 G_3)$$

$$C_1 G_2 G_3 + C_1 G_1 G_3 + C_2 G_1 G_3 + C_3 G_1 G_2 + \quad \text{(b)}$$
$$C_3 G_1 G_3 - A C_3 G_1 G_3 = \omega^2 C_1 C_2 C_3$$

3. An RC oscillator as set forth in claim 1 wherein $C_1$, $C_2$, $C_3$, have the same value C and wherein $G_1$, $G_2$, and $G_3$ have values that satisfy the following two equations:

$$G_1 G_2 G_3 = \omega^2 C^2 (2G_3 + 2G_1 + G_2) \quad \text{(a)}$$

$$\omega^2 C^2 = 3G_1 G_3 + G_2 G_3 + G_2 G_1 - A G_3 G_1 \quad \text{(b)}$$

4. An RC oscillator as set forth in claim 3 wherein $G_1 = G_3$ and $G_2$ is less than $G_1$ or $G_3$.

5. An RC oscillator as set forth in any of the previous claims wherein the first, second and third capacitors are ganged tunable capacitors connected together at the first terminal of said amplifier.

6. An RC oscillator as set forth in claim 1 including:
   a number of resistors greater than three; and
   a plural-position switch connected for selecting in each of its positions a different set of three of these resistors as said first, second and third resistors.

7. An RC oscillator as set forth in claim 6 wherein said first, second and third capacitors are ganged tunable capacitors.

8. An RC oscillator as set forth in claim 1 wherein means are provided for changing the respective conductance of one or more of said first, second and third resistors.

9. An RC oscillator as set forth in claim 1 wherein means are provided for changing the respective capacitance of one or more of said first, second and third capacitors.

* * * * *

UNITED STATES PATENT AND TRADEMARK OFFICE
CERTIFICATE OF CORRECTION

PATENT NO. : 4188593
DATED : February 12, 1980
INVENTOR(S) : Leonard Abraham Kaplan It is certified that error appears in the above-identified patent and that said Letters Patent is hereby corrected as shown below:

In column 6, line 12, "secnd" should read --second--.

In column 6, line 54, insert "selector" before --switch--

*Signed and Sealed this*

*Twenty-seventh* Day of *May 1980*

[SEAL]

Attest:

Attesting Officer

SIDNEY A. DIAMOND

Commissioner of Patents and Trademarks